(12) United States Patent
Chang et al.

(10) Patent No.: US 11,558,021 B2
(45) Date of Patent: Jan. 17, 2023

(54) OPERATIONAL AMPLIFIER AND DIRECT CURRENT VOLTAGE LEVEL CONTROL METHOD

(71) Applicant: Realtek Semiconductor Corporation, Hsinchu (TW)

(72) Inventors: Yi-Shao Chang, Hsinchu (TW); Ka-Un Chan, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/116,241

(22) Filed: Dec. 9, 2020

(65) Prior Publication Data

US 2021/0367571 A1    Nov. 25, 2021

(30) Foreign Application Priority Data

May 21, 2020   (TW) ................................. 109116979

(51) Int. Cl.
*H03F 3/45*    (2006.01)
*H03F 1/42*    (2006.01)

(52) U.S. Cl.
CPC .......... *H03F 3/45076* (2013.01); *H03F 1/42* (2013.01); *H03F 2200/375* (2013.01)

(58) Field of Classification Search
CPC ... H03F 3/45076; H03F 1/42; H03F 2200/375
USPC .................................................. 330/252–261
See application file for complete search history.

(56) References Cited

U.S. PATENT DOCUMENTS

| | | | |
|---|---|---|---|
| 6,265,941 B1 | 7/2001 | Lopata | |
| 7,183,804 B2 * | 2/2007 | Icking | H03K 19/01707 |
| | | | 326/26 |
| 7,358,780 B2 * | 4/2008 | Chou | H03F 3/45632 |
| | | | 326/82 |
| 10,523,165 B2 | 12/2019 | Kelly et al. | |
| 10,574,200 B2 | 2/2020 | Sugiura | |
| 2005/0134380 A1 * | 6/2005 | Nairn | H03F 3/005 |
| | | | 330/258 |

FOREIGN PATENT DOCUMENTS

TW           I685192 B      2/2020

\* cited by examiner

*Primary Examiner* — Samuel S Outten
*Assistant Examiner* — Khiem D Nguyen
(74) *Attorney, Agent, or Firm* — Locke Lord LLP; Tim Tingkang Xia, Esq.

(57) ABSTRACT

An operational amplifier includes a differential amplifier circuit and a common mode feedback circuit. The differential amplifier circuit includes a bias circuit, an amplifier circuit, and a load circuit. The bias circuit generates a first operation voltage. The amplifier circuit receives a pair of input signals, and generates a pair of output signals according to the input signals and the first operation voltage. The load circuit is coupled to the amplifier circuit. The common mode feedback circuit generates at least one common mode feedback voltage based on a common mode voltage and a reference voltage. The common mode voltage is associated with the output signals. The at least one common mode feedback voltage is for controlling the bias circuit and the load circuit, to control a direct current (DC) voltage level of the differential amplifier circuit.

20 Claims, 4 Drawing Sheets

OPERATIONAL AMPLIFIER AND DIRECT CURRENT VOLTAGE LEVEL CONTROL METHOD

RELATED APPLICATIONS

This application claims priority to Taiwanese Application Serial Number 109116979, filed May 21, 2020, which is herein incorporated by reference.

BACKGROUND

Technical Field

The present disclosure relates to an operational amplifier circuit. More particularly, the present disclosure relates to an operational amplifier and a direct current (DC) voltage level control method for locking a DC voltage level.

Description of Related Art

With development of circuit technology, various amplifiers are developed and are used in different applications. Amplifiers used in some applications have characteristics of high gain and high bandwidth. Based on these characteristics, DC voltage levels of the amplifiers used in the applications need to be effectively controlled (locked), such that other related circuits can operate normally.

SUMMARY

One embodiment of the present disclosure is related to an operational amplifier. The operational amplifier includes a differential amplifier circuit and a common mode feedback circuit. The differential amplifier circuit includes a bias circuit, an amplifier circuit, and a load circuit. The bias circuit generates a first operation voltage. The amplifier circuit receives a pair of input signals, and generates a pair of output signals according to the input signals and the first operation voltage. The load circuit is coupled to the amplifier circuit. The common mode feedback circuit generates at least one common mode feedback voltage based on a common mode voltage and a reference voltage. The common mode voltage is associated with the output signals. The at least one common mode feedback voltage is for controlling the bias circuit and the load circuit, to control a direct current (DC) voltage level of the differential amplifier circuit.

One embodiment of the present disclosure is related to a DC voltage level control method. The DC voltage level control method includes the following steps: generating a pair of output signals according to a pair of input signals and a first operation voltage by a differential amplifier circuit of an operational amplifier; generating at least one common mode feedback voltage based on a common mode voltage and a reference voltage by a common mode feedback circuit of the operational amplifier, in which the common mode voltage is associated with the output signals; and controlling a bias circuit of the differential amplifier circuit and a load circuit of the differential amplifier circuit by the at least one common mode feedback voltage, to control a DC voltage level of the differential amplifier circuit.

As shown in the above embodiments, the operational amplifier and the DC voltage level control method of the present disclosure can effectively control the DC voltage level of the differential amplifier circuit in the operational amplifier.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
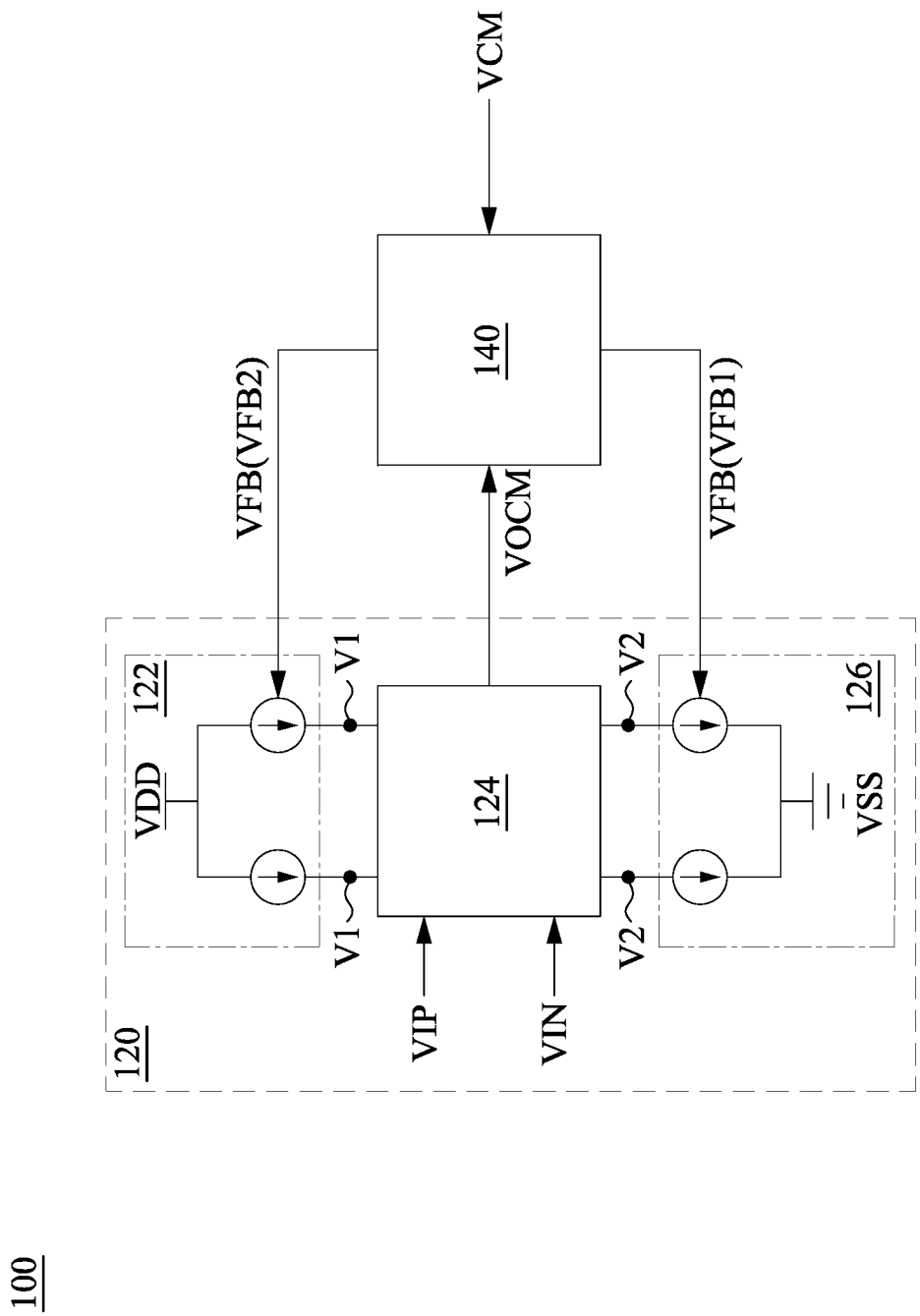
FIG. 1 is a schematic diagram illustrating an operational amplifier according to some embodiments of the present disclosure.

Reference is now made in detail to the present embodiments of the disclosure, examples of which are illustrated in the accompanying drawings. Wherever possible, the same reference numbers are used in the drawings and the description to refer to the same or like parts. The embodiments below are described in detail with the accompanying drawings, but the examples provided are not intended to limit the scope of the disclosure covered by the description. The structure and operation are not intended to limit the execution order. Any structure regrouped by elements, which has an equal effect, is covered by the scope of the present disclosure.

In the present disclosure, "connected" or "coupled" may be referred to "electrically connected" or "electrically coupled." "Connected" or "coupled" may also be referred to operations or actions between two or more elements.

Reference is made to FIG. 1. FIG. 1 is a schematic diagram illustrating an operational amplifier 100 according to some embodiments of the present disclosure.

As illustrated in FIG. 1, the operational amplifier 100 includes a differential amplifier circuit 120 and a common mode feedback circuit 140. The differential amplifier circuit 120 is coupled to the common mode feedback circuit 140. The common mode feedback circuit 140 is for controlling (locking) a direct current (DC) voltage level of the differential amplifier circuit 120.

In some embodiments, the operational amplifier 100 can be applied in analog circuits. Since amplifiers in analog circuits have characteristics of high gain and high bandwidth, a DC voltage level of the differential amplifier circuit 120 needs to be effectively controlled, such that the analog circuits can operate normally. It is noted that the present disclosure is not limited to the analog circuits.

In some embodiments, the DC voltage level of the differential amplifier circuit 120 is a default level. In some embodiments, the DC voltage level of the differential amplifier circuit 120 is an input common mode level. These embodiments are merely for illustration, and the present disclosure is not limited to these embodiments.

The differential amplifier circuit 120 includes a bias circuit 122, an amplifier circuit 124, and a load circuit 126. The bias circuit 122 is coupled to the amplifier circuit 124.

The amplifier circuit 124 is coupled to the load circuit 126 and the common mode feedback circuit 140. The common mode feedback circuit 140 is coupled to the bias circuit 122 and the load circuit 126.

The bias circuit 122 generates an operation voltage V1 according to a power voltage VDD. The amplifier circuit 124 receives a pair of input signals VIP and VIN, and generates a pair of output signals (for example, a pair of output signals VON and VOP in FIG. 2) according to the input signals VIP and VIN, the operation voltage V1, and an operation voltage V2. The amplifier circuit 124 generates a common mode voltage VOCM based on the output signals and transmits the common mode voltage VOCM to the common mode feedback circuit 140. The load circuit 126 is coupled between the amplifier circuit 124 and a ground voltage VSS.

In addition to the common mode voltage VOCM from the amplifier circuit 124, the common mode feedback circuit 140 further receives a reference voltage VCM. The common mode feedback circuit 140 generates at least one common mode feedback voltage VFB based on the common mode voltage VOCM and the reference voltage VCM. For example, the common mode feedback circuit 140 compares the common mode voltage VOCM with the reference voltage VCM, to generate the at least one common mode feedback voltage VFB. In some embodiments, the at least one common mode feedback voltage VFB includes a common mode feedback voltage VFB1 and a common mode feedback voltage VFB2. The common mode feedback voltage VFB1 may control the load circuit 126, and the common mode feedback voltage VFB2 may control the bias circuit 122, to lock the DC voltage level of the differential amplifier circuit 120.

In some related approaches, a common mode feedback circuit merely performs a common mode feedback control on one of a bias circuit or a load circuit. In the related approaches of performing the common mode feedback control only on the bias circuit, the common mode feedback circuit cannot effectively control (lock) the DC voltage level of a differential amplifier circuit if a transistor in the bias circuit undergoes a variation. Similarly, in the related approaches of performing the common mode feedback control only on the load circuit, the common mode feedback circuit cannot effectively control (lock) the DC voltage level of a differential amplifier circuit if a transistor in the load circuit undergoes a variation.

Compared to the aforementioned related approaches, the operational amplifier 100 of the present disclosure can perform the common mode feedback control on both of the bias circuit 122 and the load circuit 126. Thus, the present disclosure can effectively control (lock) the DC voltage level of the differential amplifier circuit 120.

Figure 2:
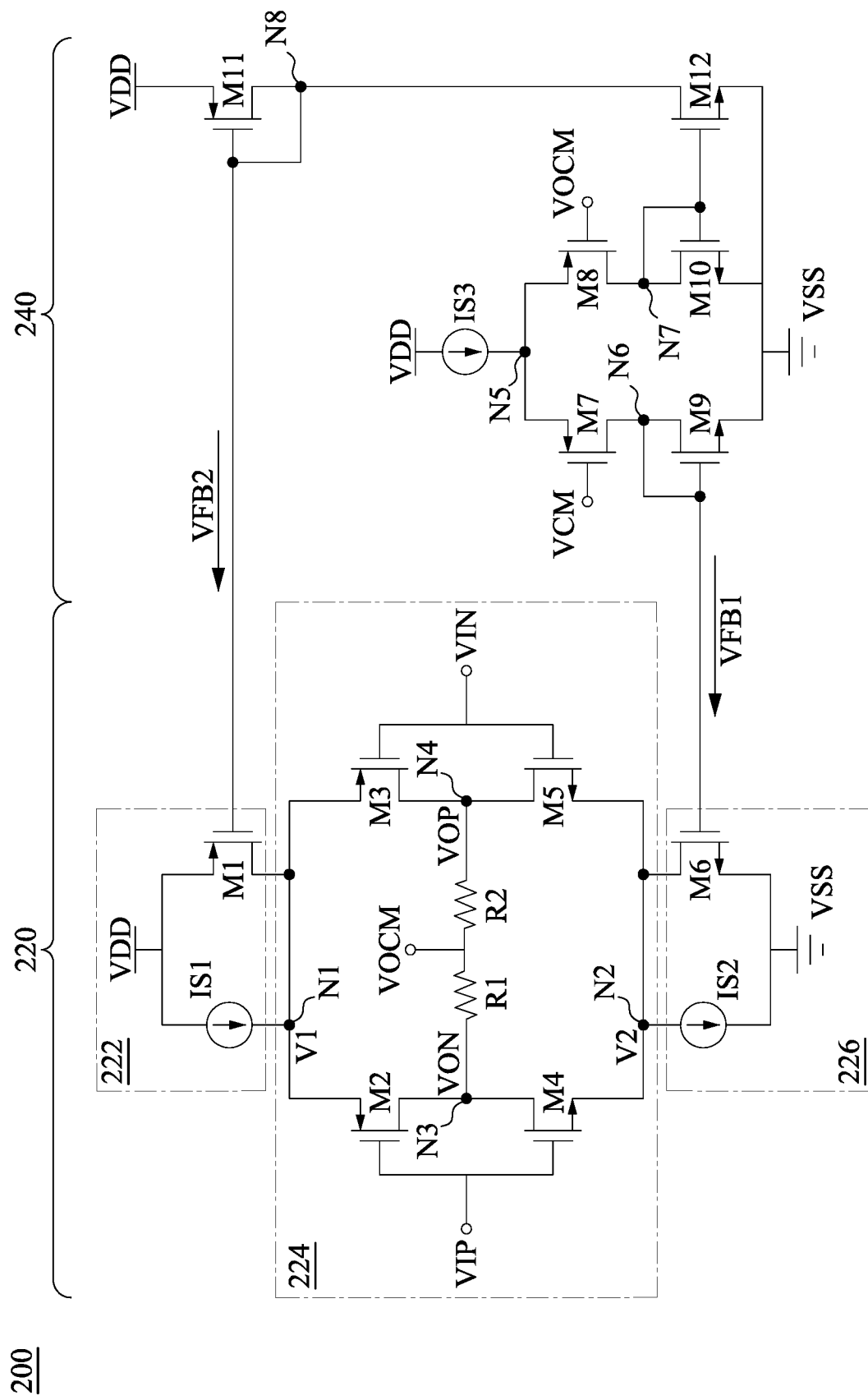
FIG. 2 is a circuit diagram illustrating an operational amplifier according to some embodiments of the present disclosure.

Reference is made to FIG. 2. FIG. 2 is a circuit diagram illustrating an operational amplifier 200 according to some embodiments of the present disclosure. As illustrated in FIG. 2, the operational amplifier 200 includes a differential amplifier circuit 220 and the common mode feedback circuit 240. The differential amplifier circuit 220 includes a bias circuit 222, an amplifier circuit 224, and a load circuit 226. The bias circuit 222 includes a current source IS1 and a transistor M1. The amplifier circuit 224 includes transistors M2-M5 and resistors R1-R2. The load circuit 226 includes a current source IS2 and a transistor M6. The common mode feedback circuit 240 includes a current source IS3 and transistors M7-M12.

In some embodiments, the transistors M1-M3, M7-M8, and M11 are implemented by P-type transistors, and the transistors M4-M6, M9-M10, and transistor M12 are implemented by N-type transistors, but the present disclosure is not limited thereto.

The current source IS1 and the transistor M1 receive the power voltage VDD and are coupled to a node N1. The transistor M1 and the current source IS1 generate the operation voltage V1 at the node N1 according to the power voltage VDD. The transistor M1 is controlled by the common mode feedback voltage VFB2. The transistor M2 and the transistor M4 are coupled in series between the node N1 and a node N2. The transistor M3 and the transistor M5 are coupled in series between the node N1 and the node N2. The operation voltage V2 is generated at the node N2. The current source IS2 and the transistor M6 are coupled to the node N2 and receive the ground voltage VSS. The transistor M6 is controlled by the common mode feedback voltage VFB1.

A control terminal (for example, a gate terminal) of the transistor M2 and a control terminal of the transistor M4 receive the input signal VIP. A control terminal of the transistor M3 and a control terminal of the transistor M5 receive the input signal VIN. Based on operations of the differential amplifier circuit 220, the output signal VON is generated at a connection node N3 of the transistor M2 and the transistor M4, and the output signal VOP is generated at a connection node N4 of the transistor M3 and the transistor M5. The resistor R1 and the resistor R2 are coupled in series between the node N3 and the node N4. The common mode voltage VOCM is generated at a connection node of the resistor R1 and the resistor R2.

The current source IS3 receives the power voltage VDD and is coupled to a node N5. The transistor M7 and the transistor M9 are coupled in series. The transistor M7 is coupled to the node N5 and a node N6. The transistor M9 is coupled to the node N6 and receives the ground voltage VSS. The transistor M8 and the transistor M10 are coupled in series. The transistor M8 is coupled to the node N5 and a node N7. The transistor M10 is coupled to the node N7 and receives the ground voltage VSS. A control terminal of the transistor M9 and a control terminal of the transistor M6 are coupled to the node N6, and the common mode feedback voltage VFB1 is generated at the node N6. A control terminal of the transistor M10 and a control terminal of the transistor M12 are coupled to the node N7. The transistor M11 receives the power voltage VDD and is coupled to a node N8. The transistor M12 is coupled to the node N8 and receives the ground voltage VSS. The connection node N8 of the transistor M11 and the transistor M12 is coupled to a control terminal of the transistor M11 and a control terminal of the transistor M1. The common mode feedback voltage VFB2 is generated at the node N8.

In operation, when the common mode voltage VOCM is higher than the reference voltage VCM, more current generated by the current source IS3 flows to the transistor M7 and the transistor M9. Accordingly, a voltage at the node N6 increases. The common mode feedback voltage VFB1 increases, such that a turned-on degree of the transistor M6 increases. In this situation, the common mode voltage VOCM in the amplifier circuit 224 is pulled down through the transistor M5, the transistor M4, and the transistor M6, such that the common mode voltage VOCM decreases and is closer to the reference voltage VCM, to control a DC voltage level of the differential amplifier circuit 220. In some embodiments, when a difference value between the common mode voltage VOCM and the reference voltage VCM is greater, the common mode feedback voltage VFB1 is higher.

On the other hand, when the common mode voltage VOCM is higher than the reference voltage VCM, less current generated by the current source 183 flows to the transistor M8 and the transistor M10. Accordingly, a voltage at the node N7 decreases, such that a turned-on degree of the transistor M12 decreases. Accordingly, a voltage at the node N8 increases. The common mode feedback voltage VFB2 increases, such that a turned-on degree of the transistor M1 deceases. In this situation, the common mode voltage VOCM in the amplifier circuit 224 is not easier to be pulled up through the transistor M3, the transistor M2, and the transistor M1, such that the common mode voltage VOCM decreases and is closer to the reference voltage VCM, to control the DC voltage level of the differential amplifier circuit 220. In some embodiments, when the difference value between the common mode voltage VOCM and the reference voltage VCM is greater, the common mode feedback voltage VFB2 is higher.

On the contrary, when the common mode voltage VOCM is lower than the reference voltage VCM, more current generated by the current source IS3 flows to the transistor M8 and the transistor M10, and less current flows to the transistor M7 and the transistor M9. Accordingly, the voltage at the node N6 decreases and the voltage at the node N7 increases, such that the turned-on degree of the transistor M6 decreases and the turned-on degree of the transistor M12 increases. Since the turned-on degree of the transistor M12 increases, the voltage at the node N8 decreases. Since the voltage at the node N6 decreases, the common mode feedback voltage VFB1 decreases. Since the voltage at the node N8 decreases, the common mode feedback voltage VFB2 decreases. In this situation, the turned-on degree of the transistor M6 decreases and a turned-on degree of the transistor M1 increases. Accordingly, the common mode voltage VOCM in the amplifier circuit 224 is not easier to be pulled down through the transistor M5, the transistor M4, and the transistor M6, and is easier to be pulled up through the transistor M3, the transistor M2, and the transistor M1, such that the common mode voltage VOCM increases and is closer to the reference voltage VCM, to control the DC voltage level of the differential amplifier circuit 220.

With the aforementioned operations, if the transistor M6 in the load circuit 226 undergoes a variation, the bias circuit 222 can be controlled by the common mode feedback voltage VFB2, to control the DC voltage level of the differential amplifier circuit 220. If the transistor M1 in the bias circuit 222 undergoes a variation, the load circuit 226 can be controlled by the common mode feedback voltage VFB1, to control the DC voltage level of the differential amplifier circuit 220.

Figure 3:
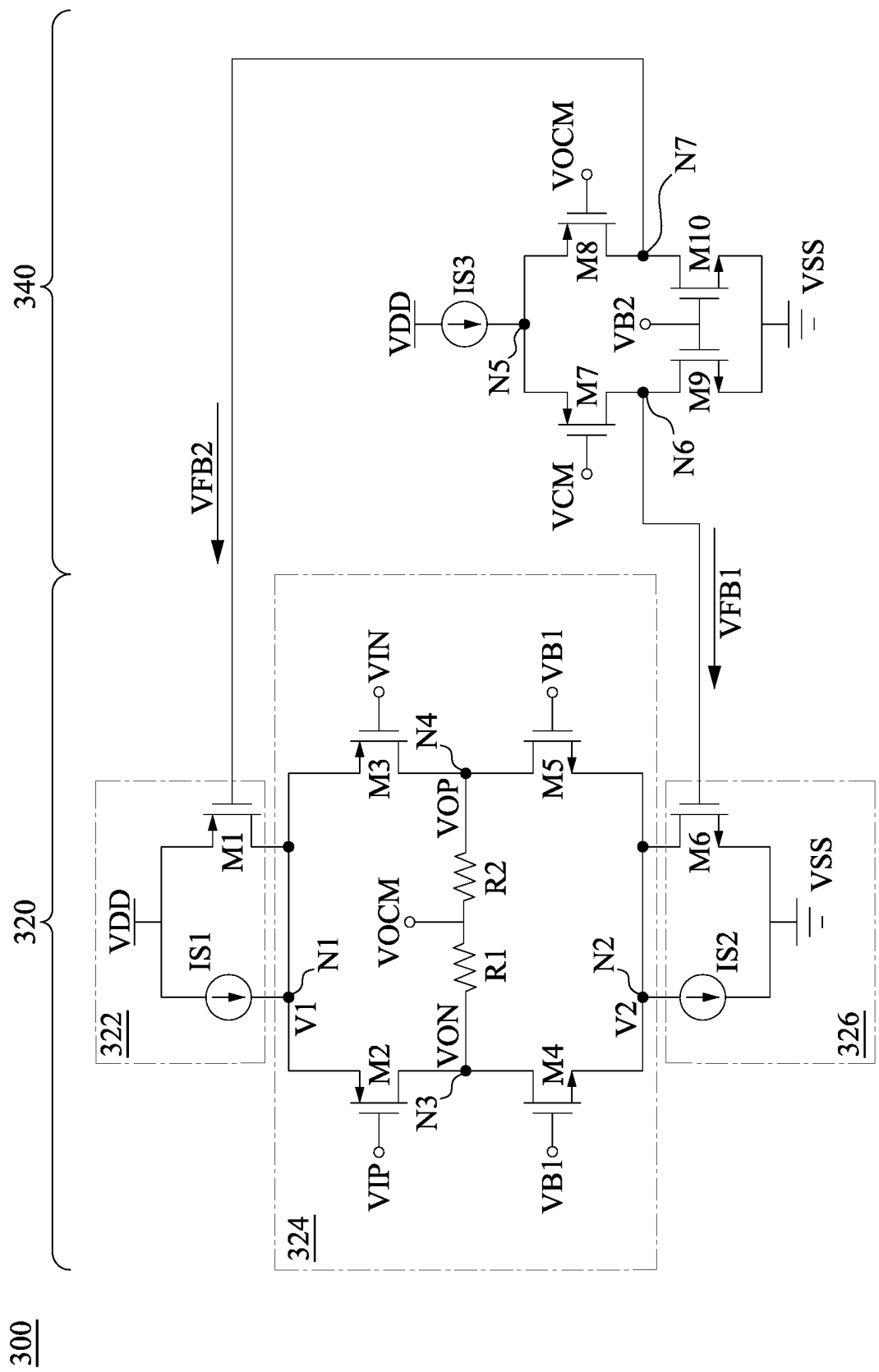
FIG. 3 is a circuit diagram illustrating an operational amplifier according to some embodiments of the present disclosure.

Reference is made to FIG. 3. FIG. 3 is a circuit diagram illustrating an operational amplifier 300 according to some embodiments of the present disclosure. As illustrated in FIG. 3, the operational amplifier 300 includes a differential amplifier circuit 320 and a common mode feedback circuit 340. The differential amplifier circuit 320 includes a bias circuit 322, an amplifier circuit 324, and a load circuit 326.

A main difference between the operational amplifier 300 in FIG. 3 and the operational amplifier 200 in FIG. 2 is that, in FIG. 3, the control terminal of the transistor M4 and the control terminal of the transistor M5 in the amplifier circuit 324 receives a bias voltage VB1, the control terminal of the transistor M9 and the control terminal of the transistor M10 in the common mode feedback circuit 340 receive a bias voltage VB2, and the control terminal of the transistor M1 in the bias circuit 322 is directly coupled to the node N7 in the common mode feedback circuit 340, to receive the common mode feedback voltage VFB2.

Similarly, if the transistor M6 in the load circuit 326 undergoes a variation, the bias circuit 322 can be controlled by the common mode feedback voltage VFB2, to control a DC voltage level of the differential amplifier circuit 320. If the transistor M1 in the bias circuit 322 undergoes a variation, the load circuit 326 can be controlled by the common mode feedback voltage VFB1, to control the DC voltage level of the differential amplifier circuit 320.

Figure 4:
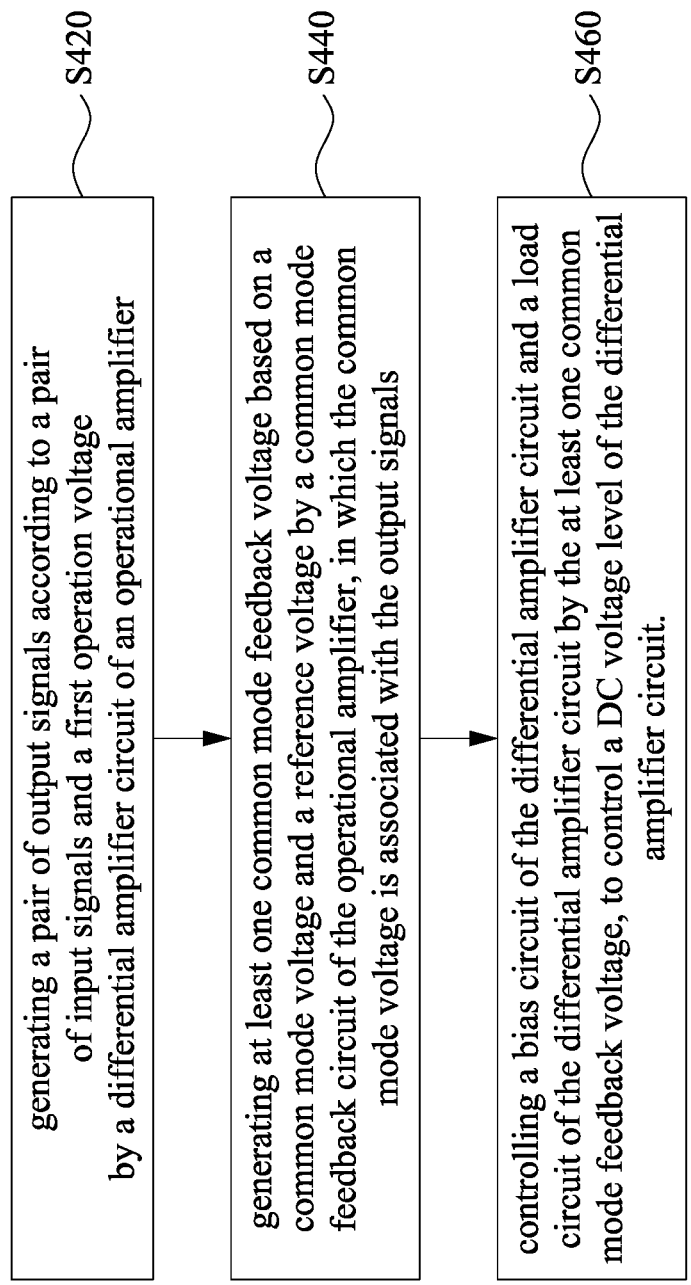
FIG. 4 is a flow diagram illustrating a direct current (DC) voltage level control method according to some embodiments of the present disclosure.

Reference is made to FIG. 4. FIG. 4 is a flow diagram illustrating a DC voltage level control method 400 according to some embodiments of the present disclosure. The DC voltage level control method 400 includes operations S420, S440, and S460.

In some embodiments, the DC voltage level control method 400 is applied in the operational amplifier 100 in FIG. 1, the operational amplifier 200 in FIG. 2, or the operational amplifier 300 in FIG. 3, but the present disclosure is not limited thereto. For ease of understanding, the DC voltage level control method 400 is discussed with reference to the operational amplifier 100 in FIG. 1.

In operation S420, the differential amplifier circuit 120 of the operational amplifier 100 generates the output signals VON and VOP according to the input signals VIP and VIN and the operation voltage V1. In some embodiments, the input signals VIP and VIN are a pair of differential input signals, and the output signals VON and VOP are a pair of differential output signals.

In operation S440, the common mode feedback circuit 140 of the operational amplifier 100 generates the at least one common mode feedback voltage VFB based on the common mode voltage VOCM and the reference voltage VCM, and the common mode voltage VOCM is associated with the output signals VON and VOP. In some embodiments, the at least one common mode feedback voltage VFB includes the common mode feedback voltage VFB1 and the common mode feedback voltage VFB2.

In operation S460, the at least one common mode feedback voltage VFB is for controlling the bias circuit 122 of the differential amplifier circuit 120 and the load circuit 126 of the differential amplifier circuit 120, to control the DC voltage level of the differential amplifier circuit 120. In some embodiments, the common mode feedback voltage VFB1 and the common mode feedback voltage VFB2 controls the load circuit 126 and the bias circuit 122 respectively. Accordingly, if a transistor in the load circuit 126 undergoes a variation, the bias circuit 122 can be controlled by the common mode feedback voltage VFB2, to control the DC voltage level of the differential amplifier circuit 120. If a transistor in the bias circuit 122 undergoes a variation, the load circuit 126 can be controlled by the common mode feedback voltage VFB1, to control the DC voltage level of the differential amplifier circuit 120.

As shown in the above embodiments, the operational amplifier and the DC voltage level control method of the present disclosure can effectively control the DC voltage level of the differential amplifier circuit in the operational amplifier.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An operational amplifier, comprising:
   a differential amplifier circuit, comprising:
      a bias circuit configured to generate a first operation voltage;
      an amplifier circuit configured to receive a pair of input signals, and generate a pair of output signals according to the input signals and the first operation voltage; and
      a load circuit coupled to the amplifier circuit; and
   a common mode feedback circuit configured to generate a first common mode feedback voltage and a second common mode feedback voltage based on a common mode voltage and a reference voltage, wherein the common mode voltage is associated with the output signals,
   wherein the first common mode feedback voltage and the second common mode feedback voltage are configured to control the bias circuit and the load circuit, to control a direct current (DC) voltage level of the differential amplifier circuit,
   wherein the common mode feedback circuit comprises a first transistor configured to receive the reference voltage, a second transistor configured to receive the common mode voltage, a third transistor, and a fourth transistor, wherein control terminals of the third transistor and the fourth transistor receive a first bias voltage, wherein the first common mode feedback voltage is generated at a first node between the first transistor and the third transistor and is transmitted to the load circuit, wherein the second common mode feedback voltage is generated at a second node between the second transistor and the fourth transistor and is transmitted to the bias circuit.

2. The operational amplifier of claim 1, wherein the common mode feedback circuit is configured to receive the common mode voltage and compare the common mode voltage with the reference voltage, to generate the first common mode feedback voltage and the second common mode feedback voltage.

3. The operational amplifier of claim 1, wherein the bias circuit comprises:
   a first current source; and
   a fifth transistor coupled to the first current source at a third node, wherein the fifth transistor and the first current source are configured to generate the first operation voltage at the third node according to a power voltage,
   wherein the fifth transistor is controlled by the second common mode feedback voltage.

4. The operational amplifier of claim 3, wherein the load circuit comprises:
   a second current source; and
   a sixth transistor coupled to the second current source at a fourth node and configured to receive a ground voltage, wherein a second operation voltage is generated at the fourth node, wherein the amplifier circuit generates the output signals according to the input signals, the first operation voltage, and the second operation voltage,
   wherein the sixth transistor is controlled by the first common mode feedback voltage.

5. The operational amplifier of claim 4, wherein the first common mode feedback voltage or the second common mode feedback voltage is higher when a difference value between the common mode voltage and the reference voltage is greater.

6. The operational amplifier of claim 4, wherein a type of the fifth transistor is different from a type of the sixth transistor.

7. The operational amplifier of claim 6, wherein the fifth transistor is a P-type transistor, and the sixth transistor is an N-type transistor.

8. The operational amplifier of claim 1, wherein the load circuit comprises:
   a current source; and
   a fifth transistor coupled to the current source at a third node and configured to receive a ground voltage, wherein a second operation voltage is generated at the third node, wherein the amplifier circuit generates the output signals according to the input signals, the first operation voltage, and the second operation voltage,
   wherein the fifth transistor is controlled by the first common mode feedback voltage.

9. The operational amplifier of claim 1, wherein the amplifier circuit is further configured to receive a second bias voltage to operate.

10. The operational amplifier of claim 9, wherein the common mode feedback circuit is further configured to receive the common mode voltage, the reference voltage, and the first bias voltage to operate.

11. A DC voltage level control method, comprising:
   generating a pair of output signals according to a pair of input signals and a first operation voltage by an amplifier circuit of a differential amplifier circuit of an operational amplifier;
   generating a first common mode feedback voltage and a second common mode feedback voltage based on a common mode voltage and a reference voltage by a common mode feedback circuit of the operational amplifier, wherein the common mode voltage is associated with the output signals; and
   controlling a bias circuit of the differential amplifier circuit and a load circuit of the differential amplifier circuit by the second common mode feedback voltage and the first common mode feedback voltage, to control a DC voltage level of the differential amplifier circuit,
   wherein the common mode feedback circuit comprises a first transistor configured to receive the reference voltage, a second transistor configured to receive the common mode voltage, a third transistor, and a fourth transistor, wherein control terminals of the third transistor and the fourth transistor receive a first bias voltage, wherein the first common mode feedback voltage is generated at a first node between the first transistor and the third transistor and is transmitted to the load circuit, wherein the second common mode feedback voltage is generated at a second node between the second transistor and the fourth transistor and is transmitted to the bias circuit.

12. The DC voltage level control method of claim 11, further comprising:
receiving the common mode voltage by the common mode feedback circuit and comparing the common mode voltage with the reference voltage by the common mode feedback circuit, to generate the first common mode feedback voltage and the second common mode feedback voltage.

13. The DC voltage level control method of claim 11, further comprising:
generating the first operation voltage at a third node according to a power voltage by a fifth transistor of the bias circuit and a first current source of the bias circuit; and
controlling the fifth transistor according to the second common mode feedback voltage.

14. The DC voltage level control method of claim 13, further comprising:
generating a second operation voltage at a fourth node by a sixth transistor of the load circuit and a second current source of the load circuit, wherein the amplifier circuit of the differential amplifier circuit generates the output signals according to the input signals, the first operation voltage, and the second operation voltage; and
controlling the sixth transistor according to the first common mode feedback voltage.

15. The DC voltage level control method of claim 14, wherein the first common mode feedback voltage or the second common mode feedback voltage is higher when a difference value between the common mode voltage and the reference voltage is greater.

16. The DC voltage level control method of claim 14, wherein a type of the fifth transistor is different from a type of the sixth transistor.

17. The DC voltage level control method of claim 16, wherein the fifth transistor is a P-type transistor, and the sixth transistor is an N-type transistor.

18. The DC voltage level control method of claim 11, further comprising:
generating a second operation voltage at a third node by a fifth transistor of the load circuit and a current source of the load circuit;
generating the output signals according to the input signals, the first operation voltage, and the second operation voltage by the amplifier circuit; and
controlling the fifth transistor by the first common mode feedback voltage.

19. The DC voltage level control method of claim 11, wherein the amplifier circuit is further configured to receive a second bias voltage to operate.

20. The DC voltage level control method of claim 19, wherein the common mode feedback circuit is further configured to receive the common mode voltage, the reference voltage, and the first bias voltage to operate.

* * * * *